(12) United States Patent
Johnson

(10) Patent No.: US 6,288,402 B1
(45) Date of Patent: Sep. 11, 2001

(54) HIGH SENSITIVITY CHARGE AMPLIFIER FOR ION BEAM UNIFORMITY MONITOR

(75) Inventor: Gary W. Johnson, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/211,170

(22) Filed: Dec. 14, 1998

(51) Int. Cl.$^7$ ................................................ H01J 37/244
(52) U.S. Cl. ........................................ 250/397; 250/492.21
(58) Field of Search ............................... 250/397, 492.21

(56) References Cited

U.S. PATENT DOCUMENTS

| | | | |
|---|---|---|---|
| 4,595,837 | * | 6/1986 | Wu et al. ........................... 250/492.2 |
| 4,724,324 | * | 2/1988 | Liebert ................................... 250/397 |
| 5,949,076 | * | 9/1999 | Ohtoshi et al. .................... 250/396 R |
| 6,020,592 | * | 2/2000 | Liebert et al. .................... 250/492.21 |
| 6,050,218 | * | 4/2000 | Chen et al. ......................... 118/723 E |

* cited by examiner

Primary Examiner—Kiet T. Nguyen
(74) Attorney, Agent, or Firm—Alan H. Thompson; L. E. Carnahan

(57) ABSTRACT

An ion beam uniformity monitor for very low beam currents using a high-sensitivity charge amplifier with bias compensation. The ion beam monitor is used to assess the uniformity of a raster-scanned ion beam, such as used in an ion implanter, and utilizes four Faraday cups placed in the geometric corners of the target area. Current from each cup is integrated with respect to time, thus measuring accumulated dose, or charge, in Coulombs. By comparing the dose at each corner, a qualitative assessment of ion beam uniformity is made possible. With knowledge of the relative area of the Faraday cups, the ion flux and areal dose can also be obtained.

13 Claims, 2 Drawing Sheets

HIGH SENSITIVITY CHARGE AMPLIFIER FOR ION BEAM UNIFORMITY MONITOR

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to ion beam uniformity, particularly to assessing the uniformity of a raster-scanned ion beam, and more particularly to a high-sensitivity charge amplifier with bias compensation utilizing Faraday cups for measuring accumulated dose, or charge, in Coulombs, whereby an ion beam uniformity assessment can be made.

Raster-scanned ion beams have been utilized for various applications, such as for ion implantation. It is desirable to assess the uniformity of a raster-scanned ion beam to assure that the desired charge is uniform throughout the target area. Commercial instruments are available to measure the charge, as exemplified by Model MP-200 Uniformity Monitor, and Model MP-100 Dose Processor, each made by Varian/Extrion Division. However, these prior instruments have the following shortcoming: (1) not sensitive enough for low-dosage operation where the average current is in the femto-amp range, and (2) their integration technique is inaccurate for arbitrary waveforms. Recently, a Faraday cup array has been developed for increasing the sensitivity range and making the operative scaleable by use of an insertable plate in the aperture, as described and claimed in U.S. application Ser. No. 09/280,231, filed Mar. 29, 1999, entitled "Versatile, High-sensitivity Faraday Cup Array For Ion Implanters", and assigned to the same assignee.

The present invention addresses the needs of low-dose, low duty-cycle pulsed ion current waveforms. The invention uses a simple operational amplifier integrator with a bias current cancellation circuit to reduce drift, resulting in a high-performance, low-cost solution. The present invention utilizes four Faraday cups located in geometric corners of the ion beam target area, with current from each cup being integrated with respect to time, thus measuring accumulated dose, or charge, in Coulombs. By comparing the dose at each corner, a qualitative assessment of ion beam uniformity can be made.

SUMMARY OF THE INVENTION

It is an object of the present invention to assess the uniformity of an ion beam on a target area.

A further object of the invention is to provide an ion beam uniformity monitor.

A further object of the invention is to provide a high-sensitivity charge amplifier for ion beam uniformity monitoring.

Another object of the invention is to assess the uniformity of a raster-scanned ion beam using four Faraday cups positioned in geometric corners of the ion beam target area for measuring accumulated dose, or charge, in Coulombs.

Another object of the invention is to monitor uniformity of an ion beam on a target area, utilizing a plurality of Faraday cups, each operatively connected to a simple operational amplifier integrator with a bias current cancellation circuit to reduce drift.

Other objects and advantages of the present invention will become apparent from the following description and accompanying drawings. Basically, the invention involves a high-sensitivity charge amplifier for ion beam uniformity monitoring. The invention addresses the needs of low-dose, low duty-cycle pulsed ion current waveforms. The invention assesses the uniformity of a raster-scanned ion beam, such as used in ion implantation, by the use of four Faraday cups placed in geometric corners of the ion beam target area. Current from each cup is integrated with respect to time, thus measuring accumulated dose, or charge, in Coulombs. By comparing the dose at each corner of the target area, a qualitative assessment of ion beam uniformity is made possible. With knowledge of the area of the cups, the ion flux and areal dose can also be obtained. The Faraday cups are each connected to a simple operational amplifier integrator with a bias current cancellation circuit.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

The present invention is directed to an ion beam uniformity monitor for very low beam currents using a sensitive charge amplifier. The present invention addresses the needs of low-dosage operation where the average current is in the femto-amp range, low duty-cycle pulsed ion current waveforms. The invention assesses the uniformity of a raster-scanned ion beam, such as used in an ion implanter, using four Faraday cups placed in the geometric corners of the ion beam target area. Current from each Faraday cup is integrated with respect to time, thus measuring accumulated dose or charge in Coulombs. By comparing the dose at each corner, a qualitative assessment of ion beam uniformity is made possible. With knowledge of the relative area of the Faraday cups, the ion flux and areal dose can also be obtained.

Since the ion beam is raster-scanned (for example, 64 Hz horizontal and 517 Hz vertical), observed current pulses have the following characteristics, assuming a 1 cm diameter Faraday cup and a 10 $\mu$A maximum beam current:

Pulse shape: About 150 $\mu$s wide every 15.6 ms,
Peak current: $5 \times 10^{-13}$ to $1 \times 10^{-4}$ A,
Average current: $5 \times 10^{-15}$ (=5 fA) to $1 \times 10^{-6}$ A,
Total dose: $1.3 \times 10^{-13}$ C (=0.13 pC) at minimum beam current.

Figure 1:
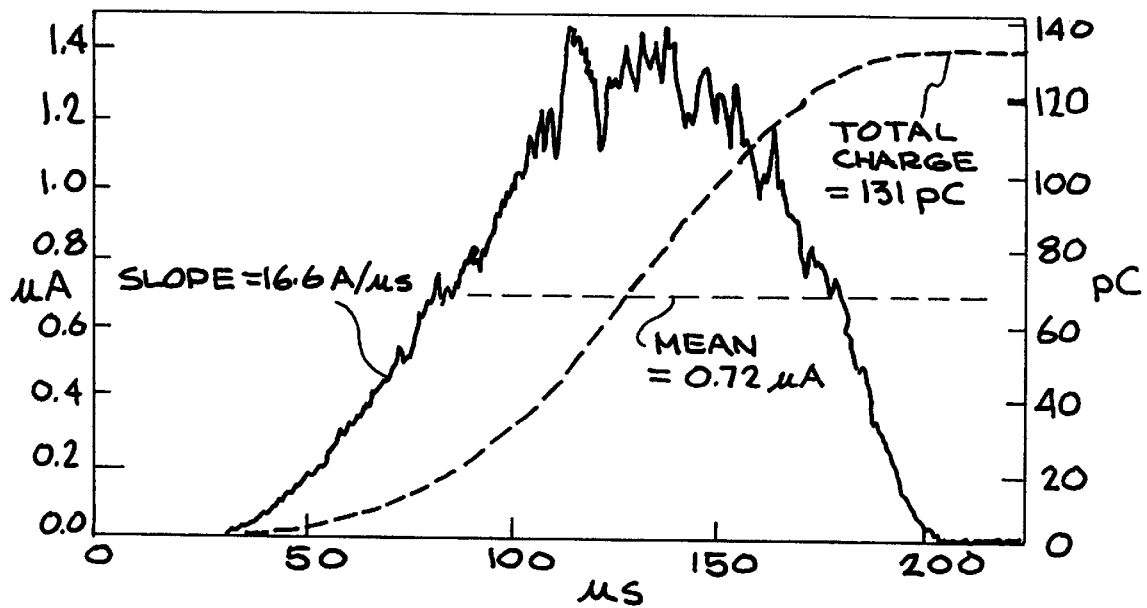
FIG. 1 graphically illustrates a typical current pulse for a high beam current.

FIG. 1 graphically illustrates a typical current pulse for a fairly high ion beam current of 1.3 $\mu$A. The pulse shape is maintained for all beam currents.

FIG. 1 shows a single current pulse from a raster-scanned ion beam into a 1 cm Faraday cup, total beam current of 1.3 $\mu$A, load of 10K$\Omega$/47pF into scope, cable of 2 ns of RG-58, about 30 pF/ft=30 pF, and instrument time constant of about 0.8 $\mu$s. FIG. 1 also shows a mean current pulse curve or line as equaling 0.72 μA, and the integral of the current pulse which indicates a total charge of 131 pC.

As pointed out above, at least one commercial instrument system is available to measure ion dose uniformity and total dose, that system being the Varian Model MP-200 Uniformity Monitor and the MP-100 Dose Processor, which are computer-based instruments that are intended for use with ion beam currents from 300 pA to 1 mA and total doses from $10^{10}$ to $10^{17}$ ions/cm$^2$, and the shortcomings of these commercial instruments have been pointed out above. By way of comparison, the uniformity dose monitor of the present invention may be used with ion beam currents from 1 pA to 100 μA, a factor of three hundred less than the commercial monitors, with total ion doses of $3 \times 10^7$ to $10^6$ ions/cm$^2$.

In accordance with the present invention, it has been found that the best way to measure the small (femto-amp range) charge pulses is with a simple integrator which yields a voltage output proportional to accumulated charge. Gain is determined by the feedback capacitor: v=q/c. A small but practical capacitance is 10 pF, which produces 100 mV/pC. Amplifier bias current plus leakage current determines long-term baseline drift and discharge time. A low bias current of 10 fA is easily achievable with commercial operational amplifiers. Fabrication techniques and installation are critical to reduce leakage current; such include insulation, shielding, short connections, etc. Generally, noise is not a problem with these circuits, even at the very low currents, due to the very limited bandwidth of a pure integrator. A total noise level of 2 fC RMS is achievable. Fast, high-amplitude pulses are accurately integrated. This is a simple, classical circuit that is well-understood. Its only limitation is that there may be objectionable leakage if very long charge storage times (minutes) are required.

Figure 2:
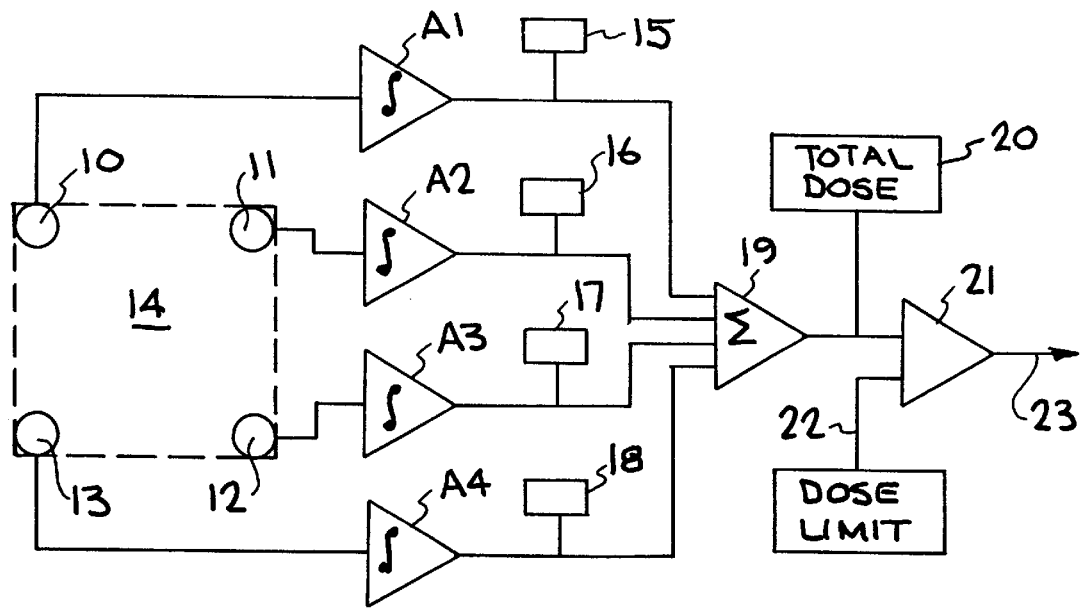
FIG. 2 schematically illustrates an embodiment of an ion beam uniformity dose assessment and control system involving Faraday cups, charge amplifiers, and a summing amplifier made in accordance with the present invention.

As shown in FIG. 2, one charge amplifier is required for each of the four Faraday cups 10, 11, 12, and 13, located in the corners of an ion beam raster or target area 14, as indicated at A1, A2, A3, and A4. The output of each amplifier A1–A4 feed via charge meters 15, 16, 17, and 18, which indicate the individual charges, into a summing amplifier 19 and the output thereof feeds through a dose meter 20 to a comparator 21. The dose meter 20 displays the average or total dose for the entire target area 14. When the average dose exceeds a preset level or limit as indicated at 22, the comparator output can then close a process shutter indicated at 23, terminating the ion beam operation. The output of each amplifier A1–A4 may also feed a panel meter or data acquisition system, not shown.

In the verification experiments, the lowest average current was about 20 fA, so even a 10 fA leakage will represent a large baseline drift. This drift could be accommodated if a microcontroller (embedded microprocessor) is added to the system. An analog technique is also possible, and has been successfully implemented.

Figure 3:
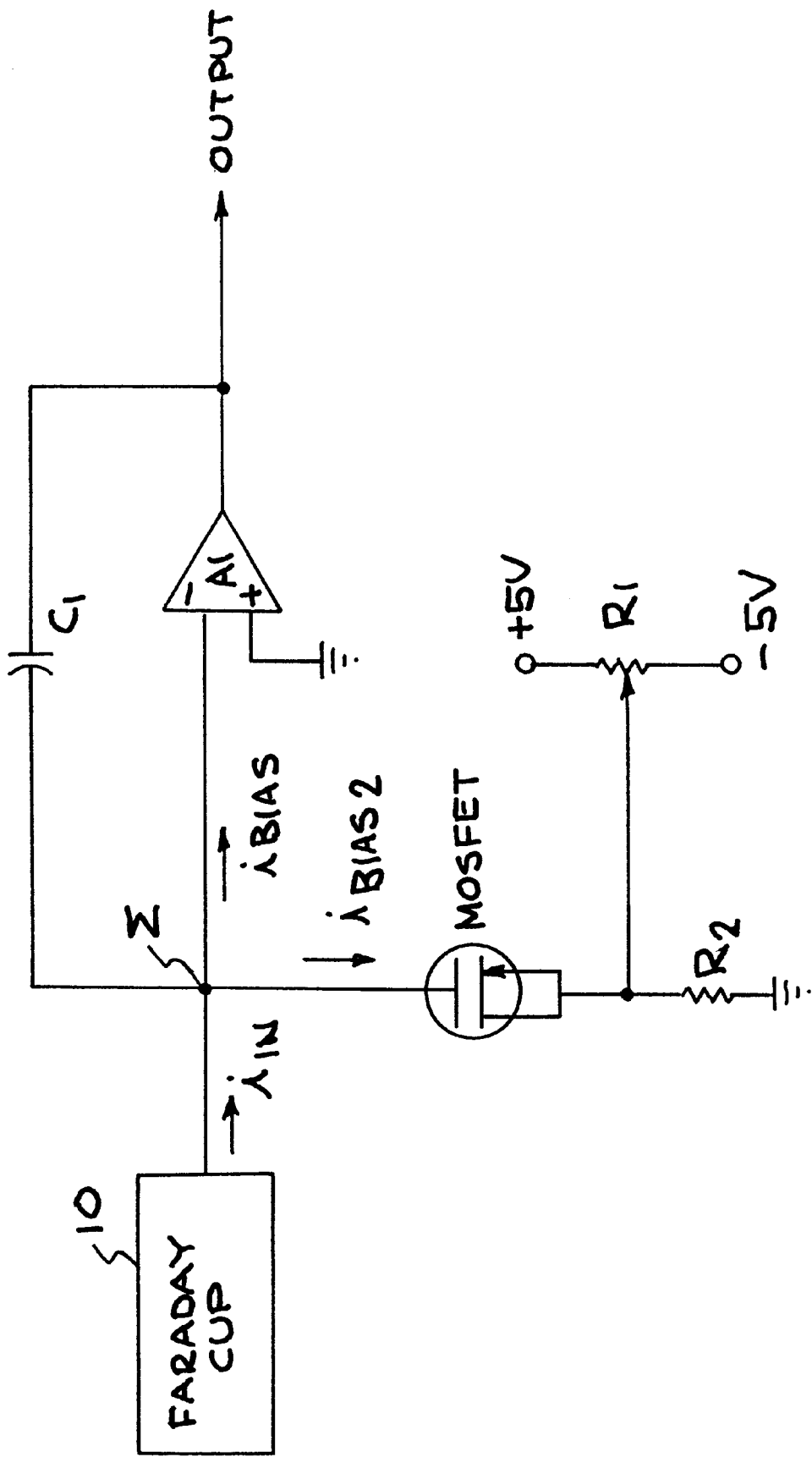
FIG. 3 schematically illustrates an embodiment of a charge amplifier with bias compensation connected between each of the Faraday cups and the summing amplifier of the FIG. 2 embodiment.

FIG. 3 illustrates a charge amplifier with bias compensation, utilized in each of the amplifiers A1–A4 of FIG. 2. The basic operational amplifier described above, may be, for example, a National Semiconductor LMC6081, and as seen in FIG. 3, the input of the operational amplifier A1, for example, may be a known MOSFET design. Like all semiconductor devices, there is some input bias current which varies from device to device and with temperature. Bias current compensation is a well-known technique for all amplifier technologies, but the topology described hereinafter applied to MOS amplifiers is deemed to be novel, since previous bias cancellation circuits include bipolar transistors for bipolar operational amplifiers, or resistor/thermistor networks.

As shown in FIG. 3, currents from the Faraday cup 10, from the integrating capacitor C1, and from the MOSFET, arrive at a summing node Σ, which is a virtual ground (zero volts at all times). With no input current (input floating), amplifier A1 bias current indicated at arrow $i_{bias}$, normally would act to charge the integrating capacitor C1. This represents an error term that needs to be canceled. The MOSFET has its drain and source terminals shorted, leaving only the gate-drain leakage path as a path for current flow. With no voltage on either side of the MOSFET resistor (R1 adjusted to center), no current, indicated at arrow $i_{bias2}$, flows and the circuit operates as if there were no bias current cancellation. By adjusting R1, a bias voltage of either polarity appears across the MOSFET and a small leakage current flows which exactly cancels amplifier bias current $i_{bias}$. The adjustment is made by observing the amplifier A1 output, such as by the charge meter 15 of FIG. 2 and neutralizing any observed drift.

As a bonus, the temperature leakage characteristic of the MOSFET approximates that of the operational amplifier A1, thus providing some temperature compensation. If the internal topology and behavior of the operational amplifier is known, the external compensating components can be optimized for better temperature tracking.

It has thus been shown that the present invention provides a high-sensitivity charge amplifier for ion beam uniformity monitoring, which is capable of low-dosage operation where the average current is in the femto-amp range and can be utilized with arbitrary waveforms. The ion beam uniformity monitor of the present invention uses a simple operational amplifier integrator with a bias current cancellation circuit to reduce drift, resulting in a high-performance, low-cost solution to the need of low-dose, low duty-cycle pulsed ion current waveforms.

The present invention has various applications, such as use for dosimetry and uniformity measurements during ion implantation or electron irradiation of materials for micro-electronics (e.g., integrated circuits), flat panel video displays (e.g., field emission displays), and materials processing, in general.

While a specific embodiment of the invention has been illustrated and described, along with various parameters, etc., such are not intended to be limiting. Modifications and changes may become apparent to those skilled in the art, and it is intended that the invention be limited only by the scope of the appended claims.

What is claimed is:

1. An ion beam uniformity monitor, comprising:
   a plurality of Faraday cups positioned so as to be located in an ion beam raster area,
   a charge amplifier with bias compensation including a MOSFET operatively connected to each of said Faraday cups, and
   a data acquisition system connected to receive an output of each charge amplifier.

2. The monitor of claim 1, wherein said data acquisition system includes a summing amplifier for averaging the outputs of said charge amplifiers.

3. The monitor of claim 2, wherein said data acquisition system additionally includes a comparator circuit connected to the summing amplifier and having an output, whereby when an average dose at the ion beam raster area exceeds a present level, the comparator output can control the dose of an applied ion beam.

4. The monitor of claim 3, wherein said data acquisition system additionally includes a dose meter intermediate each operational amplifier and said summary amplifier, and a dose meter intermediate said summing amplifier and said comparator circuit.

5. The monitor of claim 1, wherein said MOSFET includes an adjustable resistor for controlling bias current.

6. The monitor of claim 1, wherein said MOSFET has shorted drain and source terminals, whereby only a gate-drain leakage path provides a path for current flow, the current flow being controlled by the adjustable resistor.

7. The monitor of claim 1, wherein said plurality of Faraday cups comprises four located in geometric corners of said ion beam raster area.

8. In an ion beam uniformity monitor utilizing a plurality of Faraday cups placed in an ion beam target area, each Faraday cup being connected to a charge amplifier, the improvement comprising bias compensation means including a MOSFET for each of said charge amplifiers.

9. The improvement of claim 8, wherein said MOSFET includes drain-source terminals and gate-drain terminals, wherein said drain-source terminals are shorted, and wherein said gate-drain terminals are connected to an adjustable resistor, whereby current flow is controlled by adjustment of said adjustable resistor.

10. The improvement of claim 9, wherein said charge amplifier with bias compensation includes a Faraday cup, an integrating capacitor, a MOSFET, and an operational amplifier, all connected at a summing node at virtual ground.

11. An ion beam uniformity monitor for a raster-scanned ion beam having an average current in the femto-amp range with low duty-cycle pulsed ion current waveforms, which includes:

a plurality of Faraday cups placed so as to be located in a raster area of the ion beam, each Faraday cup being connected to a charge amplifier, and a bias compensating means including a MOSFET for each of said charge amplifiers.

12. The ion beam uniformity monitor of claim 11, wherein the average current is in the range from 1 pA to 100 $\mu$A.

13. The ion beam uniformity monitor of claim 11, wherein said plurality of Faraday cups comprises four located in geometric corners of said ion beam raster area.

* * * * *